United States Patent
Oh et al.

(10) Patent No.: US 10,539,844 B2
(45) Date of Patent: Jan. 21, 2020

(54) LIQUID CRYSTAL DISPLAY DEVICE AND METHOD OF MANUFACTURING THE SAME

(71) Applicant: LG DISPLAY CO., LTD., Seoul (KR)

(72) Inventors: Kum Mi Oh, Seoul (KR); In Sang Jung, Paju-si (KR); Sung Hoon Kim, Ulsan (KR)

(73) Assignee: LG DISPLAY CO., LTD., Seoul (KR)

( * ) Notice: Subject to any disclaimer, the term of this patent is extended or adjusted under 35 U.S.C. 154(b) by 382 days.

(21) Appl. No.: 14/699,694

(22) Filed: Apr. 29, 2015

(65) Prior Publication Data
US 2015/0309346 A1 Oct. 29, 2015

(30) Foreign Application Priority Data
Apr. 29, 2014 (KR) ......................... 10-2014-0051967

(51) Int. Cl.
*G02F 1/136* (2006.01)
*G02F 1/1368* (2006.01)
(Continued)

(52) U.S. Cl.
CPC .......... *G02F 1/1368* (2013.01); *H01L 27/124* (2013.01); *H01L 27/127* (2013.01);
(Continued)

(58) Field of Classification Search
CPC ......... G02F 1/133512; G02F 1/136286; H01L 29/78696; H01L 29/78621; H01L 29/0615;
(Continued)

(56) References Cited

U.S. PATENT DOCUMENTS 5,729,308 A * 3/1998 Yamazaki ........... G02F 1/13624
257/66
6,628,349 B1 * 9/2003 Takei .................. H01L 27/1214
349/43
(Continued)

FOREIGN PATENT DOCUMENTS

| CN | 1374705 A | 10/2002 |
| CN | 1375113 A | 10/2002 |
| CN | 101241285 A | 8/2008 |

*Primary Examiner* — Paisley L Wilson
(74) *Attorney, Agent, or Firm* — Birch, Stewart, Kolasch & Birch, LLP

(57) ABSTRACT

Discussed are a liquid crystal display (LCD) device and a method of manufacturing the LCD device. The LCD device can include a plurality of pixel areas defined by intersections of a plurality of gate lines and a plurality of data lines, a gate disposed in each of the plurality of pixel areas, a gate insulator disposed to cover the gate, an active layer disposed on only the gate with the gate insulator therebetween, a thin film transistor (TFT) configured to include a source, which is disposed at a first side of the active layer, and a drain disposed at a second side of the active layer, a pixel electrode connected to the drain of the TFT and configured to supply a data voltage to a corresponding pixel area, a common electrode configured to supply a common voltage to the corresponding pixel area, and a lightly doped drain (LDD) disposed between the active layer and the source and between the active layer and the drain. At least a portion of the LDD can be disposed on the gate.

17 Claims, 11 Drawing Sheets

(51) Int. Cl.
  *H01L 27/12*  (2006.01)
  *H01L 29/786*  (2006.01)
  *G02F 1/1335*  (2006.01)

(52) U.S. Cl.
  CPC .. *G02F 1/133512* (2013.01); *H01L 29/78678* (2013.01); *H01L 29/78696* (2013.01)

(58) Field of Classification Search
  CPC ............ H01L 29/7833; H01L 29/6659; H01L 27/124; H01L 27/127
  See application file for complete search history.

(56) References Cited

U.S. PATENT DOCUMENTS

| | | |
|---|---|---|
| 6,724,444 B2 | 4/2004 | Ashizawa et al. |
| 6,724,513 B2 * | 4/2004 | Murade ............. G02F 1/136213 257/E27.111 |
| 7,166,864 B2 * | 1/2007 | Ahn .................... G02F 1/13458 257/72 |
| 8,174,633 B2 | 5/2012 | Segawa et al. |
| 2003/0025848 A1 * | 2/2003 | Sera ................. G02F 1/136209 349/43 |
| 2005/0275610 A1 | 12/2005 | Roh et al. |
| 2006/0008932 A1 | 1/2006 | Oh et al. |
| 2007/0164953 A1 * | 7/2007 | Huang ............. G02F 1/133514 345/88 |
| 2011/0024763 A1 | 2/2011 | Noda et al. |
| 2012/0115286 A1 | 5/2012 | Kuniyoshi et al. |
| 2013/0001568 A1 | 1/2013 | Yamazaki et al. |
| 2014/0016057 A1 * | 1/2014 | Tsai ................. G02F 1/136209 349/43 |
| 2015/0198850 A1 * | 7/2015 | Tasaka ................. G02F 1/1368 349/46 |

* cited by examiner

LIQUID CRYSTAL DISPLAY DEVICE AND METHOD OF MANUFACTURING THE SAME

CROSS-REFERENCE TO RELATED APPLICATIONS

This application claims the priority benefit of the Korean Patent Application No. 10-2014-0051967 filed on Apr. 29, 2014, which is hereby incorporated by reference as if fully set forth herein.

BACKGROUND

Field of the Invention

The present invention relates to a liquid crystal display (LCD) device in which a transmittance of a pixel area is enhanced and a method of manufacturing the same which can increase an efficiency of a channel design and a manufacturing efficiency of a thin film transistor (TFT).

Discussion of the Related Art

With the advance of various portable electronic devices such as mobile communication terminals, smart phones, tablet computers, notebook computers, etc., the demand for flat panel display (FPD) devices applicable to the portable electronic devices is increasing.

Liquid crystal display (LCD) devices, plasma display panels (PDPs), field emission display (FED) devices, light emitting diode display devices, organic light emitting display devices, etc. are being studied as the FPD devices.

In such FPD devices, the LCD devices are being continuously expanded in application field because the LCD devices are easily manufactured due to the advance of manufacturing technology and realize drivability (for example, easy implementation and/or driving) of a driver, low power consumption, a high-quality image, and a large screen.

FIG. 1 is a diagram illustrating a structure where a plurality of pixels are arranged in a related art LCD device. FIG. 2 is a plan view illustrating a pixel structure of the related art LCD device.

Referring to FIGS. 1 and 2, in the related art LCD device, a red (R) sub-pixel, a green (G) sub-pixel, and a blue (B) sub-pixel constitute one pixel. The R, G, and B sub-pixels are arranged in a stripe type.

In FIG. 2, one sub-pixel among all pixels of the related art LCD device is illustrated, and a structure of a lower substrate based on a fringe field switch (FFS) mode is illustrated.

A thin film transistor (TFT) having a top gate type is formed in a sub-pixel. Each of a plurality of sub-pixels is defined by a data line and a gate line which intersect each other. A TFT is formed in an area where the data line intersects the gate line. Each of the plurality of sub-pixels includes a common electrode and a pixel electrode. In FIG. 2, the common electrode is not illustrated.

A light shield layer is disposed under a TFT so as to prevent light, emitted from a backlight, from being incident on an active layer.

FIG. 3 is a diagram schematically illustrating a related art method of manufacturing an LCD device.

Referring to (a) in FIG. 3, a light shield layer 15 is formed on a substrate 10, and a passivation layer 20 is formed on the light shield layer 15. Subsequently, a semiconductor layer is formed on the passivation layer 20, and a gate insulator 40 is formed on the semiconductor layer. Subsequently, a gate (gate electrode) 50 is formed to overlap the semiconductor layer on the gate insulator 40. Then, a photoresist PR is formed on the gate 50, and high-concentration impurities N+ are doped on the semiconductor layer.

An active layer 31, a source (source electrode) 32, and a drain (drain electrode) 33 are formed by doping the high-concentration impurities into the semiconductor layer using the photoresist PR. Portions of the semiconductor layer into which the impurities become injected are the source 32 and the drain 33, and a portion of the semiconductor layer into which the impurities are not injected becomes the active layer 31.

Subsequently, referring to (b) and (c) in FIG. 3, low-concentration impurities are doped by using the photoresist PR and the gate 50 as a mask. Therefore, a lightly doped drain (LDD) 34 is formed between the active layer 31 and the source 32 and between the active layer 31 and the drain 33.

Subsequently, referring to (c) in FIG. 3, a TFT is finished by removing the photoresist PR.

In the related art method of manufacturing the LCD device, after the gate 50 is formed, a channel of a TFT is formed by doping impurities. Therefore, when forming a dual channel (in other words, a TFT having first and second channel regions or sub-channels), a first part of an active portion (corresponding to the first sub-channel) and a second part of the active portion (corresponding to the second sub-channel) is blocked by the gate 50. Also, as in a portion A of FIG. 2, in order to secure a doping area of the high-concentration impurities N+, the active portion may be formed in a U-shape so that an active pattern is formed outside the gate 50. Therefore, an area of the TFT increases by a width of the active portion which is formed outside the gate 50.

A black matrix BM for covering the TFT and a gate line which are formed on the lower substrate is formed on an upper substrate, and when an area of the TFT increases, an area of the black matrix increases. When the area of the black matrix increases, an aperture ratio of a pixel area decreases. For example, a width of the black matrix BM for covering the TFT and the gate line is X (for example, 19 μm), and the aperture ratio of the pixel area decreases by a width of the black matrix BM increased by the active pattern.

Moreover, in the TFT having the top gate type, the light shield layer 15 is formed for preventing light, emitted from the backlight, from being incident on the active portion. As described above, since a mask and a manufacturing process are applied in forming the light shield layer 15, the manufacturing cost increases, and the manufacturing efficiency is reduced.

SUMMARY

Accordingly, the present invention is directed to provide a liquid crystal display (LCD) device and a method of manufacturing the same that substantially obviate one or more problems due to limitations and disadvantages of the related art.

An aspect of the present invention is directed to provide an LCD device in which a transmittance of a pixel area increases.

Another aspect of the present invention is directed to provide a method of manufacturing an LCD device, which can increase an efficiency of a channel design of a TFT.

Another aspect of the present invention is directed to provide an LCD device and a method of manufacturing the same, in which a size of a TFT is reduced. In accordance with various embodiments, this can be achieved by manufacturing a reliable TFT.

Another aspect of the present invention is directed to provide an LCD device having a narrow bezel and a method of manufacturing the same.

Another aspect of the present invention is directed to provide a method of manufacturing an LCD device, which reduces the manufacturing cost. In accordance with various embodiments, this can be achieved by a manufacturing method which omits a mask process in forming a lower substrate.

Another aspect of the present invention is directed to provide a method of manufacturing an LCD device, which reduces the number of manufacturing processes. In accordance with various embodiments, this can be achieved by a manufacturing method, which removes a light shield layer.

Another aspect of the present invention is directed to provide an LCD device and a method of manufacturing the same, in which a driving performance of a TFT is enhanced. In accordance with various embodiments, this can be achieved by using low temperature poly silicon (LTPS) as a material of an active layer.

In addition to the aforesaid objects of the present invention, other features and advantages of the present invention will be described below, but will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a liquid crystal display (LCD) device which can include: a plurality of pixel areas defined by intersections of a plurality of gate lines and a plurality of data lines; a gate disposed in each of the plurality of pixel areas; a gate insulator disposed to cover the gate; an active layer disposed on only the gate with the gate insulator therebetween; a thin film transistor (TFT) configured to include a source, which is disposed at a first side of the active layer, and a drain disposed at a second side of the active layer; a pixel electrode connected to the drain of the TFT and configured to supply a data voltage to a corresponding pixel area; a common electrode configured to supply a common voltage to the corresponding pixel area; and a lightly doped drain (LDD) disposed between the active layer and the source and between the active layer and the drain, wherein at least a portion of the LDD is disposed on the gate.

In one or more embodiments, only a portion of the LDD is disposed on the gate (in other words, overlaps the gate).

In one or more embodiments, the entire LDD is disposed on the gate (in other words, overlaps the gate).

In one or more embodiments, the active layer and the LDD (or the portion of the LDD) may be aligned in the same direction (e.g., an X-axis direction of the display device, e.g. a direction of a gate line of the plurality of gate lines). For example, a direction of lateral sides or boundaries of the active layer and the LDD (or the portion of the LDD) may be parallel or substantially parallel. For example, a direction of current flow in the LDD (or the portion of the LDD) may be the same as a direction of current flow in the active layer.

The current flow direction may, for example, be parallel or substantially parallel to a longitudinal axis of the active layer.

In one or more embodiments, an area of the active layer lies fully within an area of the gate.

In one or more embodiments, an area of the LDD lies fully within an area of the gate.

In one or more embodiments, an area of the LDD lies partially outside an area of the gate.

In one or more embodiments, the LDD is disposed up to an area overlapping the gate.

In one or more embodiments, the LDD (144) is disposed up to an outer portion of the gate.

In one or more embodiments, the TFT is formed in a bottom gate structure.

In one or more embodiments, a pixel area comprises a red sub-pixel, a green sub-pixel, and a blue sub-pixel, and the red sub-pixel, the green sub-pixel, and the blue sub-pixel are arranged in a stripe type.

In one or more embodiments, a pixel area comprises a red sub-pixel, a green sub-pixel, a blue sub-pixel, and a white sub-pixel, and the red sub-pixel, the green sub-pixel, the blue sub-pixel, and the white sub-pixel are arranged in a PenTile type.

A width of a black matrix, which is formed on an upper substrate to cover a gate line, may be formed to 4 μm to 15.0 μm.

In one or more embodiments, the display device further comprises a black matrix disposed to cover the TFT.

In one or more embodiments, the active layer comprises a single channel, or a multichannel comprising a plurality of sub-channels.

In another aspect of the present invention, there is provided a method of manufacturing a liquid crystal display (LCD) device which can include: forming a gate in each of a plurality of pixel areas on a substrate; forming a gate insulator to cover the gate; forming a semiconductor layer on the gate insulator, and forming a photoresist on the semiconductor layer; doping high-concentration impurities on the semiconductor layer by using the photoresist as a mask to form an active layer (including for example a single channel or a multichannel including a plurality of sub-channels), a source, and a drain on the semiconductor layer; and doping low-concentration impurities on the semiconductor layer by using the photoresist as the mask to form a lightly doped drain (LDD) between the active layer and the source and between the active layer and the drain.

In one or more embodiments, the LDD is disposed up to an area overlapping the gate.

In one or more embodiments, the LDD is disposed up to an outer portion of the gate.

In one or more embodiments, the method further comprises: forming a pixel electrode which is connected to the drain of the TFT and supplies a data voltage to a corresponding pixel area; and forming a common electrode which supplies a common voltage to the corresponding pixel area.

In one or more embodiments, a pixel area comprises a red sub-pixel, a green sub-pixel, and a blue sub-pixel, and the red sub-pixel, the green sub-pixel, and the blue sub-pixel are arranged in a stripe type.

In one or more embodiments, a pixel area comprises a red sub-pixel, a green sub-pixel, a blue sub-pixel, and a white sub-pixel, and the red sub-pixel, the green sub-pixel, the blue sub-pixel, and the white sub-pixel are arranged in a PenTile type.

In one or more embodiments, the active layer comprises a single channel, or a multichannel comprising a plurality of sub-channels.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
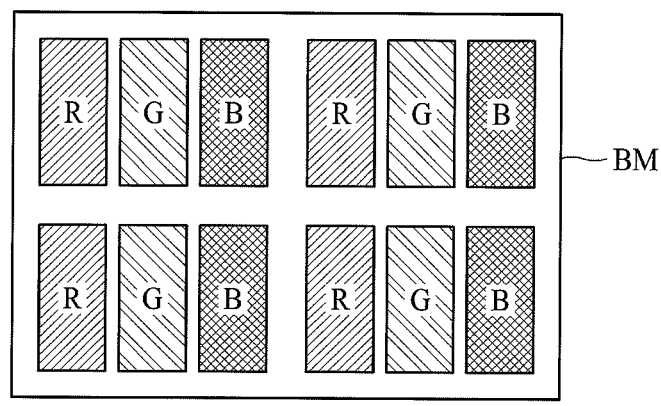
FIG. 1 is a diagram illustrating a structure where a plurality of pixels are arranged in a related art LCD device.

Reference will now be made in detail to the exemplary embodiments of the present invention, examples of which are illustrated in the accompanying drawings. Wherever possible, the same reference numbers will be used throughout the drawings to refer to the same or like parts.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover a case where a third structure is disposed therebetween.

Before providing a detailed description with reference to the drawings, LCD devices have been variously developed in a twisted nematic (TN) mode, a vertical alignment (VA) mode, an in-plane switching (IPS) mode, and a fringe field switching (FFS) mode according to a scheme of adjusting the alignment of liquid crystal.

Among the modes, the IPS mode and the FFS mode are modes in which a plurality of pixel electrodes and common electrodes are arranged on a lower substrate (TFT array substrate), and the alignment of liquid crystal is adjusted by vertical electric fields between the pixel electrodes and the common electrodes.

Especially, the IPS mode is a mode in which a plurality of pixel electrodes and common electrodes are alternately arranged in parallel, and horizontal electric fields are respectively generated between the pixel electrodes and the common electrodes, thereby adjusting the alignment of liquid crystal. In the IPS mode, the alignment of the liquid crystal is not adjusted at an upper side portion of each of the pixel electrodes and common electrodes, and thus, light transmittance is reduced in a corresponding area.

The FFS mode has been developed for overcoming the limitations of the IPS mode. In the IPS mode, the pixel electrode and the common electrode are provided in plurality to be separated from each other with an insulating layer therebetween. In this case, the FFS mode is a mode in which one of the pixel electrodes and common electrodes is provided in a plate shape or a pattern, and the other electrodes are provided in a finger shape, thereby adjusting the alignment of liquid crystal with fringe fields generated between the pixel electrodes and common electrodes.

An LCD device according to embodiments of the present invention has a structure of the IPS mode or the FFS mode. The LCD device according to embodiments of the present invention includes a liquid crystal panel, a backlight unit that supplies light to the liquid crystal panel, and a driving circuit unit. All the components of the LCD device in this and other embodiments are operatively coupled and configured.

The driving circuit unit includes a timing controller (T-con), a data driver (D-IC), a gate driver (G-IC), a touch sensing driver, a backlight driver, and a power supply.

Here, all or a portion of the driving circuit unit may be provided on the liquid crystal panel in a chip-on glass (COG) type or a chip-on film (COF, chip on flexible printed circuit) type.

The liquid crystal panel includes an upper substrate and a lower substrate which are bonded to each other with a liquid crystal layer therebetween. A plurality of pixels Clc (liquid crystal cells) are arranged in a matrix type in the liquid crystal panel. The liquid crystal panel adjusts a transmittance of light passing through the liquid crystal layer of each of the plurality of pixels according to a data voltage, thereby displaying an image based on an image signal.

The upper substrate includes: a black matrix BM that defines a pixel area to correspond to each of the plurality of pixels; red, green, and blue color filters that are formed in respective pixel areas defined by a plurality of the black matrixes; and an overcoat layer that is formed to cover the red, green, and blue color filters and the black matrix and planarizes the upper substrate.

The lower substrate includes a pixel array that includes the plurality of pixels for driving the liquid crystal layer. Each of the plurality of pixels includes a thin film transistor (TFT), a pixel electrode, and a common electrode. The upper substrate is bonded to the lower substrate by a sealant, and a display area (an active area) of the liquid crystal panel is shut off from the outside by the sealant.

Hereinafter, an LCD device and a method of manufacturing the same according to embodiments of the present invention will be described in detail with reference to the accompanying drawings.

Figure 4:
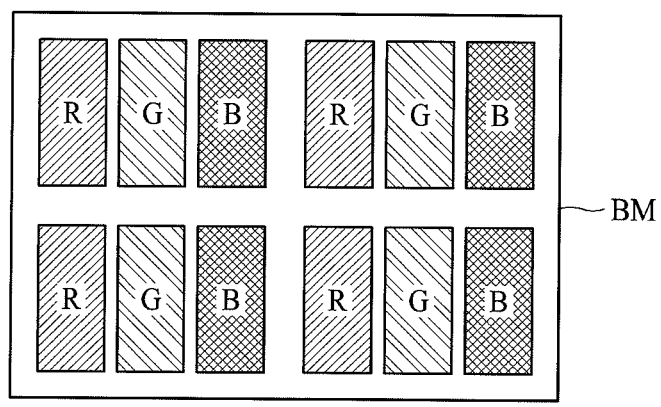
FIG. 4 is a diagram illustrating a plurality of pixels which are arranged in a stripe type, in an LCD device according to an embodiment of the present invention.
Figure 5:
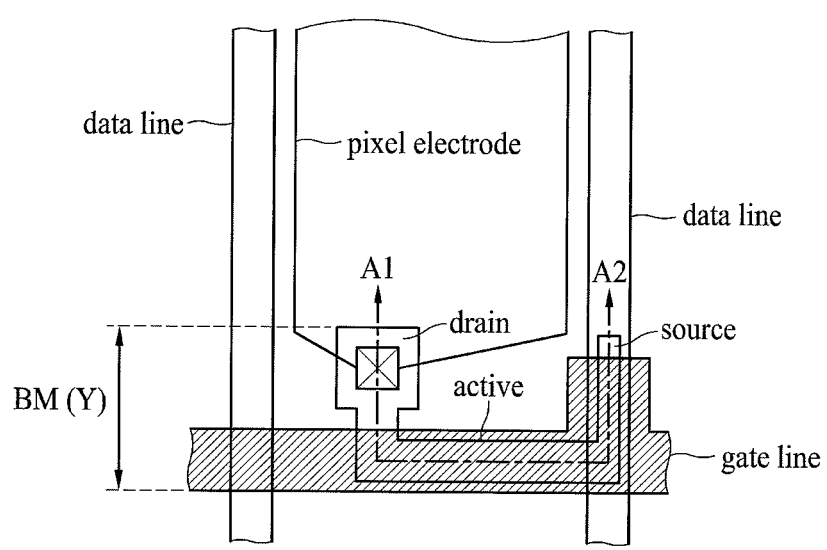
FIG. 5 is a plan view illustrating a pixel structure and a pixel area having an increased aperture ratio in an LCD device according to an embodiment of the present invention.
Figure 6:
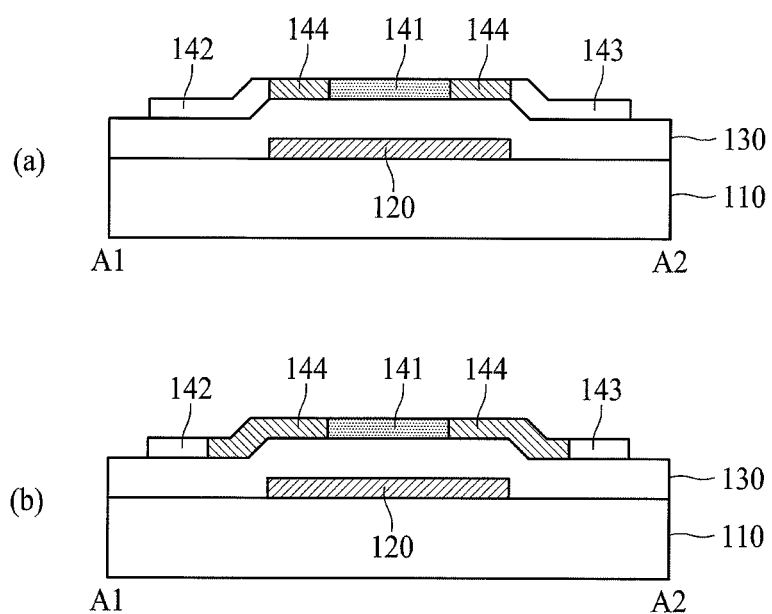
FIG. 6 is a cross-sectional view taken along line A1-A2 of FIG. 5.

FIG. 4 is a diagram illustrating a plurality of pixels which are arranged in a stripe type, in an LCD device according to an embodiment of the present invention. FIG. 5 is a plan view illustrating a pixel structure and a pixel area having an increased aperture ratio in an LCD device according to an embodiment of the present invention. FIG. 6 is a cross-sectional view taken along line A1-A2 of FIG. 5.

Referring to FIG. 4, in the LCD device according to an embodiment of the present invention, a red (R) sub-pixel, a green (G) sub-pixel, and a blue (B) sub-pixel constitute one pixel. The R, G, and B sub-pixels are arranged in a stripe type. R, G, and B sub-pixels may be alternately arranged in an X-axis direction. Also, a plurality of R sub-pixels may be arranged in one row in a Y-axis direction, a plurality of G sub-pixels may be arranged in one row in the Y-axis direction, and a plurality of B sub-pixels may be arranged in one row in the Y-axis direction.

Referring to FIG. 5, one sub-pixel among all sub-pixels of the LCD device according to an embodiment of the present invention is illustrated, and a structure of a lower substrate based on the IPS or FFS mode is illustrated.

Each of a plurality of sub-pixels is defined by a data line and a gate line which intersect each other. A TFT is formed in an area where the data line intersects the gate line. Also, each of the plurality of sub-pixels includes a common electrode and a pixel electrode. In FIG. 5, the common electrode is not illustrated. The pixel electrode supplies a data voltage, applied through the data line, to a pixel area. The common electrode supplies a common voltage (Vcom) to the pixel area.

Here, in the FFS mode, the pixel electrode and the common electrode may be formed in a pixel electrode on top structure where the pixel electrode is formed on the common electrode. On the other hand, the pixel electrode and the common electrode may be formed in a common electrode on top structure where the common electrode is formed on the pixel electrode.

Referring to (a) in FIG. 6, the TFT includes a gate 120, an active layer 141, an insulating layer 130, a lightly doped drain (LDD) 144, a source 143, and a drain 142. The TFT is formed in a bottom gate structure where the gate 120 is disposed under the active layer 141.

When amorphous silicon (a-Si) is used as a material of the active layer 141, an operation speed is slow, and there is a limitation in designing a fine line width. In order to overcome such limitations, low temperature poly silicon (LTPS) may be used as a material of the active layer 141. LTPS has electron mobility higher than that of amorphous silicon (a-Si) and thus is advantageous for realizing low power. Also, since a degree of integration is high, an aperture ratio of a sub-pixel increases, and thus, high image quality is realized.

A gate line and the gate 120 of the TFT are formed on a substrate 110. A gate insulator (GI) 130 is formed to cover the gate line and the gate 120.

The active layer 141 is formed on the gate insulator 130 to overlap the gate 120. The source 143 is formed at one side of the active layer 141, and the drain 142 is formed at the other side. The active layer 141 is formed as a channel of the TFT, and the LDD 144 is formed between the active layer 141 and the source 143 and between the active layer 141 and the drain 142.

Here, a length of the LDD 144 may be formed to match an end of the gate 120. That is, the length of the LDD 144 may be formed from an end of the active layer 141 to a portion overlapping the end of the gate 120.

However, the present embodiment is not limited thereto, and as illustrated in (b) of FIG. 6, the length of the LDD 144 may be formed to extend to a portion in which the gate 120 is not disposed. That is, the LDD 144 may be formed longer than the end of the gate 120 to exceed a length from the end of the active layer 141 to a portion overlapping the end of the gate 120. That is, the LDD 144 may be disposed up to an area overlapping the gate 120. As another example, the LDD 144 may be disposed up to an outer portion of the end of the gate 120.

When the LDD 144 is disposed to match the end of the gate 120 or the LDD 144 is disposed to pass over the end of the gate 120, the source 143 and the drain 142 may be disposed at an outer portion of the gate 120. As described above, in the LCD device according to an embodiment of the present invention, the length of the LDD 144 may be optionally adjusted depending on a characteristic of the TFT.

The source 143 directly contacts the data line. The drain 142 contacts the pixel electrode of the pixel area through a contact hole.

Although not shown, an interlayer dielectric (ILD) and a planarizing layer can be formed on the TFT. The planarizing layer may be formed of photo acryl (PAC) and/or may have a thickness of 2.0 μm to 3.0 μm, and planarizes the lower substrate.

In the pixel electrode on top structure, the common electrode is formed on the planarizing layer, and a passivation layer is formed on the common electrode. Also, the pixel electrode is formed on the passivation layer.

In the common electrode on top structure, the pixel electrode is formed on the planarizing layer, and the passivation layer is formed on the pixel electrode. Also, the common electrode is formed on the passivation layer.

Here, the common electrode and the pixel electrode may be formed of a transparent conductive material such as indium tin oxide (ITO).

In the LCD device according to an embodiment of the present invention including the above-described elements, the TFT is formed in the bottom gate type, and an active portion is formed of LTPS, thereby enhancing a driving performance of the TFT.

To describe a feature of a pixel structure of the LCD device according to an embodiment of the present invention, the active layer 141 is formed on only the gate 120.

As described above, since the active layer 141 is formed on only the gate 120, a degree of freedom of an impurity doping process increases in forming the channel, the source 143, and the drain 142, and thus, a high-reliability TFT is manufactured, and a size of the TFT is reduced. In this context, "degree of freedom" may denote a grade to which a process may be freely changed under a predetermined condition.

Figure 2:
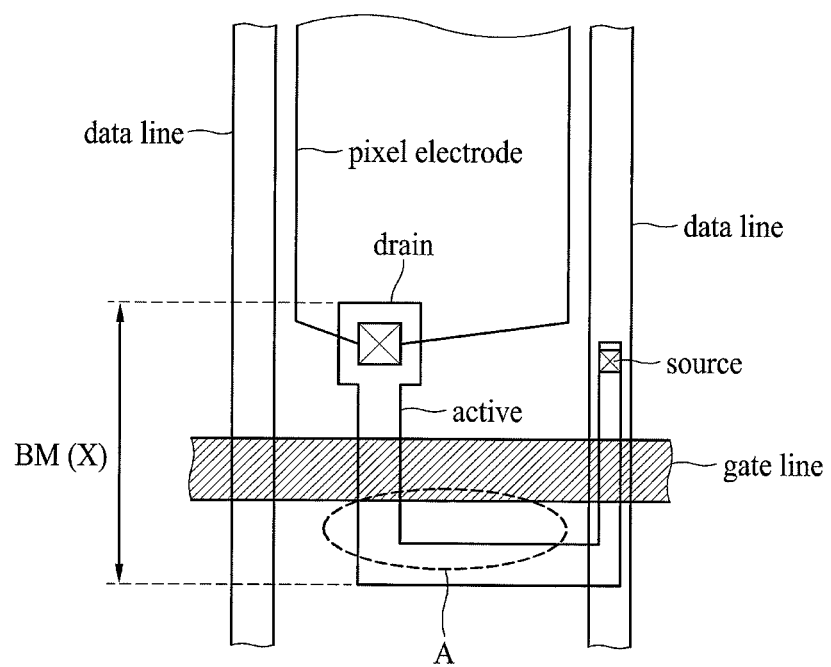
FIG. 2 is a plan view illustrating a pixel structure of the related art LCD device.
Figure 3:
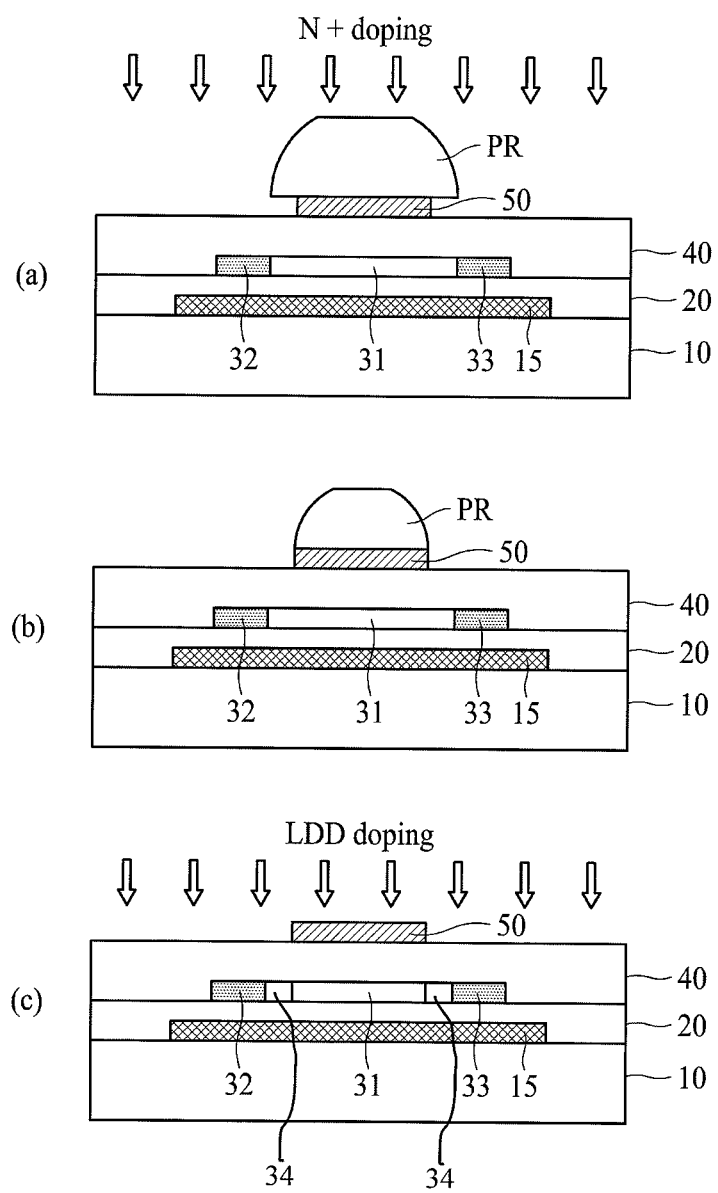
FIG. 3 is a diagram schematically illustrating a related art method of manufacturing an LCD device.

In the related art, as illustrated in a portion A of FIG. 2, an active pattern is formed outside a gate, and for this reason, an area of a TFT increases. On the other hand, in the LCD device according to an embodiment of the present invention, since the active layer 141 is formed on only the gate 120, a degree of freedom of an impurity doping process increases in a manufacturing process, and a size of the TFT is reduced.

Figure 14:
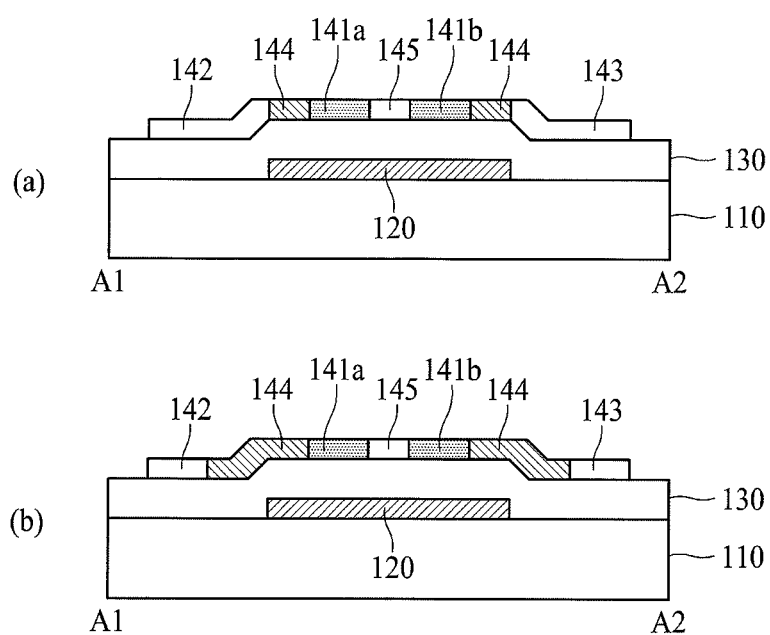
FIG. 14 is a cross-sectional view illustrating an embodiment where a TFT includes a multichannel.

Moreover, in the LCD device according to an embodiment of the present invention, as illustrated in FIG. 6, a single channel 141 may be formed in the TFT. However, the present embodiment is not limited thereto. In the LCD device according to an embodiment of the present invention, as illustrated in FIG. 14, a plurality of sub-channels, e.g. two sub-channels 141a and 141b, may be formed in the TFT. A layer 145 disposed between a first multichannel 141a and a second multichannel 141b may be formed of an LDD or formed as a high-concentration impurity (N+) layer. The plurality of sub-channels (e.g., the two sub-channels 141a and 141b) may form a multichannel. In other words, a multichannel may include a plurality of sub-channels, which may be electrically connected in series to one another and may be physically separated from one another.

When the single channel is formed in the TFT, an active portion is formed on the gate 120 to have one pattern, and when the multichannel is formed in the TFT, the active portion is formed on the gate 120 to have a multi-pattern by using a mask having the multi-pattern. As described above, since the single channel 141 or the multichannel including the plurality of sub-channels 141a and 141b is/are formed on the gate 120, a channel may be formed in various types depending on a desired characteristic of the TFT.

Particularly, the black matrix BM for covering the TFT and gate line of the lower substrate is formed on the upper substrate. When an area of the TFT increases, an area of the black matrix BM increases, and thus, an aperture ratio of the pixel area is reduced.

In the LCD device according to an embodiment of the present invention, the active layer 141 of the TFT is formed on only the gate 120, and thus, a size of the TFT is reduced. Therefore, a width of the black matrix BM for covering the gate line and the TFT decreases by the reduced size of the TFT, thereby increasing an aperture ratio of the pixel area.

Particularly, as illustrated in FIG. 14, since the sub-channels 141a and 141b are formed in the TFT having the bottom gate type, a width of the black matrix BM is reduced, and an aperture ratio of a pixel area increases.

For example, a width of the black matrix BM for covering the gate line and the TFT is reduced from X to Y (for example, 15 μm), as shown in FIG. 5, and thus, a width of the pixel area increases by the reduced width of the black matrix BM in the same pixel layout. Therefore, an aperture ratio of the pixel area increases, thereby enhancing a quality of an image displayed by the LCD device.

As a detailed example, in an LCD device having a size of 5.46 inches and QHD resolution (QHD: Quad High Definition), a transmittance of 2.7% of a pixel area increases to 3.0%.

Moreover, in addition to TFTs in the pixel area, TFTs formed in a non-display area may be manufactured in the same type, and thus, a narrow bezel is realized by decreasing a size of a bezel that covers the non-display area.

Figure 7:
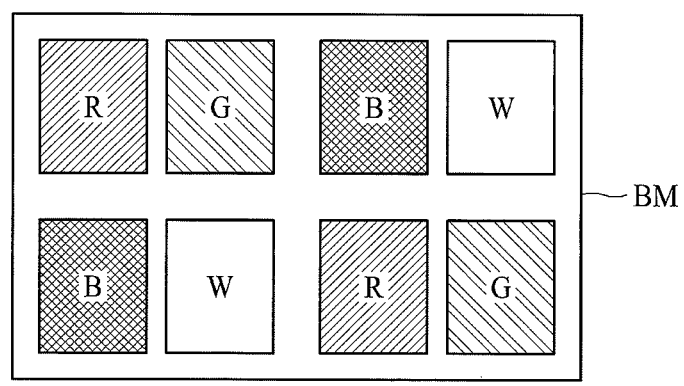
FIG. 7 is a diagram illustrating a plurality of pixels which are arranged in a PenTile type, in an LCD device according to another embodiment of the present invention.
Figure 8:
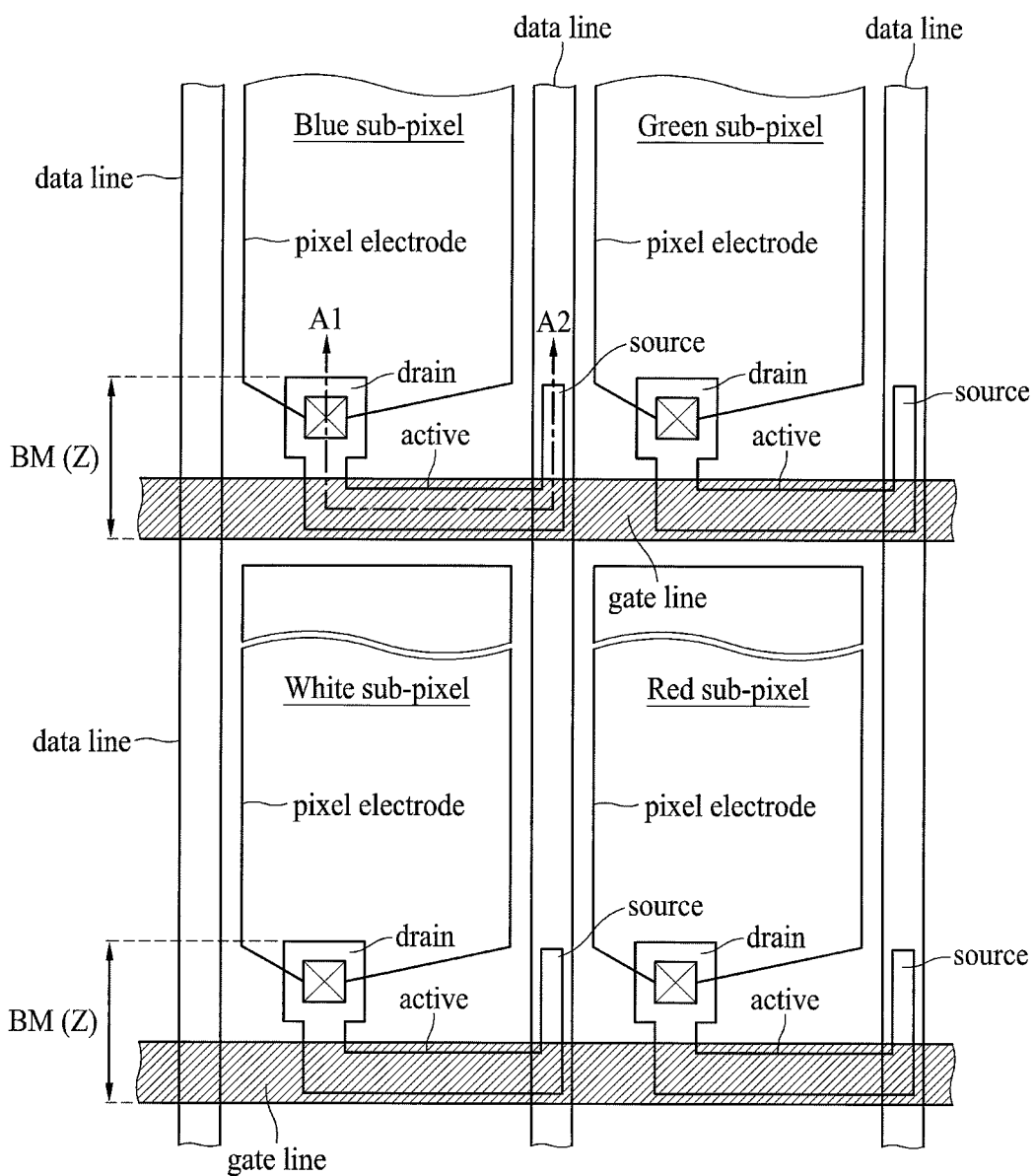
FIG. 8 is a diagram illustrating an increase in an aperture ratio of a pixel area when a plurality of pixels are arranged in a PenTile type, in an LCD device according to another embodiment of the present invention.

FIG. 7 is a diagram illustrating a plurality of pixels which are arranged in a PenTile type, in an LCD device according to another embodiment of the present invention. FIG. 8 is a diagram a diagram illustrating an increase in an aperture ratio of a pixel area when a plurality of pixels are arranged in a PenTile type, in an LCD device according to another embodiment of the present invention.

Referring to FIG. 7, in the LCD device according to another embodiment of the present invention, red (R), green (G), blue (B), and white (W) sub-pixels constitute one pixel, and the R, G, B, and W sub-pixels are arranged in a PenTile type.

In a first pixel, a red sub-pixel and a green sub-pixel may be arranged on a first row, and a blue sub-pixel and a white sub-pixel may be arranged on a second row. In a second pixel adjacent to the first pixel, a blue sub-pixel and a white sub-pixel may be arranged on a first row, and a red sub-pixel and a green sub-pixel may be arranged on a second row. In order to increase luminance, in addition to R, G, and B sub-pixels, a white (W) sub-pixel may be added, and thus, one pixel may be configured with a plurality of sub-pixels respectively having four colors. A plurality of sub-pixels which are adjacent to each other in a horizontal direction may have different colors, and a plurality of sub-pixels which are adjacent to each other in a vertical direction may have different colors. However, the present embodiment is not limited thereto, and an arrangement structure of R, G, B, and W sub-pixels may be changed in one pixel depending on the case.

Referring to FIG. 8, one pixel among all pixels of the LCD device according to another embodiment of the present invention is illustrated, and a structure of a lower substrate based on the IPS or FFS mode is illustrated.

Each of a plurality of pixels is defined by a data line and a gate line which intersect each other. A TFT is formed in an area where the data line intersects the gate line. Also, each of the plurality of pixels includes a common electrode and a pixel electrode. In FIG. 8, the common electrode is not illustrated.

The TFT may be formed in the same structure as in the embodiment of the present invention shown in FIG. 6. The TFT includes a gate 120, an active layer 141, an insulating layer 130, an LDD 144, a source 143, and a drain 142. The TFT is formed in the bottom gate structure where the gate 120 is disposed under the active layer 141. LTPS may be used as a material of the active layer 141 formed in the TFT of the lower substrate.

A gate line and the gate 120 of the TFT are formed on a substrate 110. A gate insulator (GI) 130 is formed to cover the gate line and the gate 120.

The active layer 141 is formed on the gate insulator 130 to overlap the gate 120. The source 143 is formed at one side of the active layer 141, and the drain 142 is formed at the other side. The active layer 141 is formed as a channel of the TFT, and the LDD 144 is formed between the active layer 141 and the source 143 and between the active layer 141 and the drain 142.

Here, the source 143 directly contacts the data line. The drain 142 contacts the pixel electrode of the pixel area through a contact hole.

Although not shown, an ILD and a planarizing layer are formed on the TFT. The planarizing layer may be formed of PAC and/or may have a thickness of 2.0 μm to 3.0 μm, and planarizes the lower substrate.

In the pixel electrode on top structure, the common electrode is formed on the planarizing layer, and a passivation layer is formed on the common electrode. Also, the pixel electrode is formed on the passivation layer.

In the common electrode on top structure, the pixel electrode is formed on the planarizing layer, and the passivation layer is formed on the pixel electrode. Also, the common electrode is formed on the passivation layer.

Here, the common electrode and the pixel electrode may be formed of a transparent conductive material such as ITO.

In the LCD device according to an embodiment of the present invention including the above-described elements, the TFT is formed in the bottom gate type, and an active portion is formed of LTPS, thereby enhancing a driving performance of the TFT.

To describe a feature of a pixel structure of the LCD device according to another embodiment of the present invention, the active layer 141 is formed on only the gate 120.

As described above, since the active layer 141 is formed on only the gate 120, a degree of freedom of an impurity doping process increases in forming the channel, the source 143, and the drain 142, and thus, a high-reliability TFT is manufactured, and a size of the TFT is reduced.

In the related art, as illustrated in the portion A of FIG. 2, an active pattern is formed outside a gate, and for this reason, an area of a TFT increases. On the other hand, in the LCD device according to another embodiment of the present invention, since the active layer 141 is formed on only the gate 120, a degree of freedom of an impurity doping process increases in a manufacturing process, and a size of the TFT is reduced.

Moreover, in the LCD device according to an embodiment of the present invention, as illustrated in FIG. 6, the single channel 141 may be formed in the TFT. As another example, as illustrated in FIG. 14, a multichannel including a plurality of sub-channels, e.g. the first and second sub-channels 141a and 141b, may be formed in the TFT. When the single channel is formed in the TFT, an active portion is formed on the gate 120 to have one pattern. When the multichannel is formed in the TFT, the active portion is formed on the gate 120 to have a multi-pattern by using a mask having the multi-pattern. As described above, since the single channel 141 or the multichannel including the plurality of sub-channels 141a and 141b is/are formed on the gate 120, a channel may be formed in various types depending on a desired characteristic of the TFT.

Particularly, in the LCD device according to another embodiment of the present invention, the active layer 141 of the TFT is formed on only the gate 120, and thus, a size of the TFT is reduced. Therefore, a width of the black matrix BM for covering the gate line and the TFT decreases by the reduced size of the TFT. An aperture ratio of the pixel area increases by the reduced width of the black matrix BM.

For example, a width of the black matrix BM for covering the gate line and the TFT is reduced from X to Z (for example, 12.5 μm), and thus, a width of the pixel area increases by the reduced width of the black matrix BM in the same pixel layout. Therefore, an aperture ratio of the pixel area increases, thereby enhancing a quality of an image displayed by the LCD device.

As a detailed example, in an LCD device having a size of 6.0 inches and QHD resolution, a transmittance of a pixel area increases to 21.9%.

Moreover, in addition to TFTs in the pixel area, TFTs formed in a non-display area may be manufactured in the same type, and thus, a narrow bezel is realized by decreasing a size of a bezel that covers the non-display area.

Figure 9:
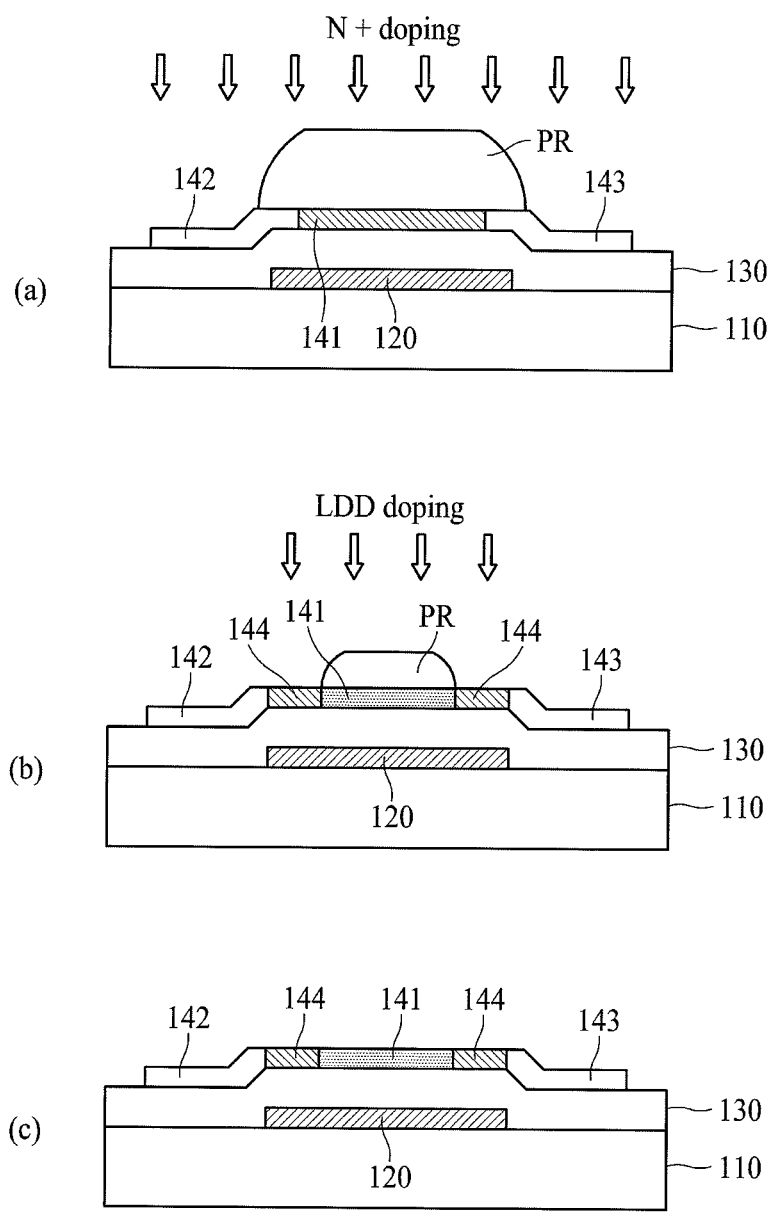
FIG. 9 is a diagram illustrating a method of manufacturing an LCD device according to another embodiment of the present invention.

FIG. 9 is a diagram illustrating a method of manufacturing an LCD device according to another embodiment of the present invention. The method will be described in detail with reference to (a)-(c) in FIG. 9.

Referring to (a) in FIG. 9, a gate line and a gate 120 of a TFT are formed on a substrate 110. Subsequently, a gate insulator 130 is formed to cover the gate line and the gate 120. Subsequently, a semiconductor layer is formed on the gate insulator 130, and a photoresist PR is formed on the semiconductor layer. Then, high-concentration impurities N+ are doped into the semiconductor layer (in other words, portions of the semiconductor layer are highly N doped (N+ doped)) by using the photoresist PR as a mask.

Subsequently, referring to (b) in FIG. 9, an active layer 141, a source 143, and a drain 142 are formed by doping the high-concentration impurities into the semiconductor layer using the photoresist PR. Portions of the semiconductor layer into which the impurities are injected become the source 143 and the drain 142, and a portion of the semiconductor layer into which the impurities are not injected becomes the active layer 141.

Subsequently, referring to (b) in FIG. 9, low-concentration impurities are doped by using the photoresist PR, of which a height and a width are reduced by doping the high-concentration impurities, as a mask. Therefore, an LDD 144 is formed between the active layer 141 and the source 143 and between the active layer 141 and the drain 142.

However, the present embodiment is not limited thereto. For example, a first photoresist may be formed on the semiconductor layer, and then, the high-concentration impurities N+ may be doped on the semiconductor layer by using the first photoresist as a mask.

The first photoresist may be ashed, and then, a second photoresist may be formed on the semiconductor layer. Subsequently, the low-concentration impurities may be doped on the semiconductor layer by using the second photoresist as a mask. Therefore, the LDD 144 may be formed between the active layer 141 and the source 143 and between the active layer 141 and the drain 142.

Subsequently, referring to (c) of FIG. 9, the LDD 144 is formed, and then, the TFT is finished by removing the photoresist PR.

Here, a length of the LDD 144 may be formed to match an end of the gate 120. That is, the length of the LDD 144 may be formed from an end of the active layer 141 to a portion overlapping the end of the gate 120.

Figure 10:
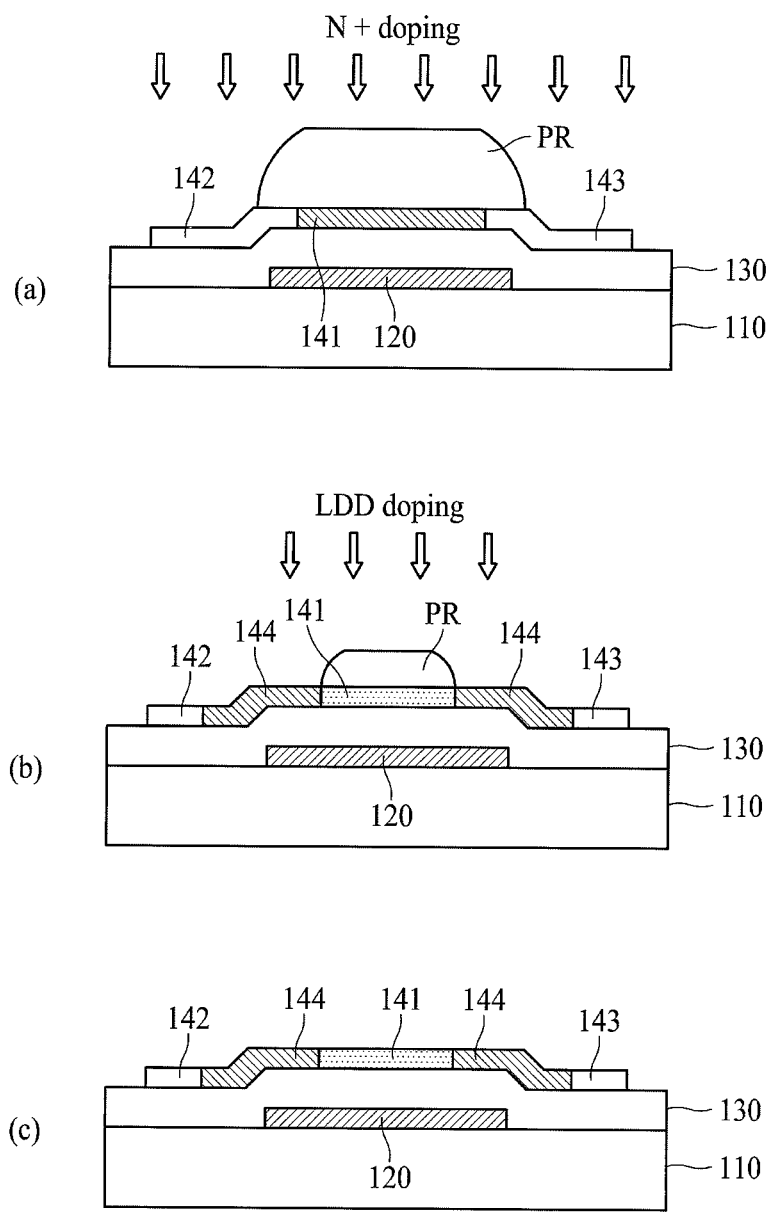
FIG. 10 is a diagram illustrating a method of manufacturing an LCD device according to another embodiment of the present invention.

FIG. 10 is a diagram illustrating a method of manufacturing an LCD device according to another embodiment of the present invention. Except that an LDD is formed to have a greater length, the method of manufacturing the LCD device according to the embodiment of the present invention illustrated in FIG. 10 performs the same manufacturing process as the method illustrated in FIG. 9. Thus, the same descriptions provided with regard to the above-described embodiment are not repeated.

Referring to (a) and (b) in FIG. 10, low-concentration impurities are doped by using a photoresist PR, of which a height and a width are reduced by doping high-concentration impurities, as a mask. Therefore, an LDD 144 is formed between an active layer 141 and a source 143 and between an active layer 141 and a drain 142.

Here, a length of the LDD 144 may be formed to extend to a portion in which a gate 120 is not disposed. That is, the LDD 144 may be formed longer than an end of the gate 120 to exceed a length from an end of the active layer 141 to a portion overlapping the end of the gate 120.

As described above, in the LCD device according to an embodiment of the present invention, the length of the LDD 144 may be optionally adjusted depending on a characteristic of the TFT.

However, the present embodiment is not limited thereto. For example, a first photoresist may be formed on the semiconductor layer, and then, the high-concentration impurities N+ may be doped on the semiconductor layer by using the first photoresist as a mask.

The first photoresist may be ashed, and then, a second photoresist may be formed on the semiconductor layer.

Subsequently, the low-concentration impurities may be doped on the semiconductor layer by using the second photoresist as a mask. Therefore, the LDD 144 may be formed between the active layer 141 and the source 143 and between the active layer 141 and the drain 142.

Subsequently, referring to (c) in FIG. 10, the LDD 144 is formed, and then, the TFT is finished by removing the photoresist PR.

A black matrix BM for covering the TFT and a gate line which are formed on a lower substrate is formed on an upper substrate. When an area of the TFT increases, an area of the black matrix increases. When the area of the black matrix increases, an aperture ratio of a pixel area decreases.

In the LCD device according to an embodiment of the present invention, the active layer 141 of the TFT is formed on only the gate 120, and thus, a size of the TFT is reduced. Therefore, a width of the black matrix BM for covering the gate line and the TFT decreases by the reduced size of the TFT, thereby increasing an aperture ratio of the pixel area.

For example, as illustrated in FIGS. 4 and 5, when the R, G, and B sub-pixels are arranged in the stripe type, a width of the black matrix BM for covering the gate line and the TFT is reduced from X to Y, and thus, a width of the pixel area increases by the reduced width of the black matrix BM in the same pixel layout. Therefore, an aperture ratio of the pixel area increases, thereby enhancing a quality of an image displayed by the LCD device.

As a detailed example, in the LCD device having a size of 5.46 inches and QHD resolution, a transmittance of 2.7% of the pixel area increases to 3.0%.

As another example, as illustrated in FIGS. 7 and 8, when the R, G, B, and W sub-pixels are arranged in the PenTile type, a width of the black matrix BM for covering the gate line and the TFT is reduced from X to Z, and thus, a width of the pixel area increases by the reduced width of the black matrix BM in the same pixel layout. Therefore, an aperture ratio of the pixel area increases, thereby enhancing a quality of an image displayed by the LCD device.

As a detailed example, in the LCD device having a size of 6.0 inches and QHD resolution, a transmittance of the pixel area increases to 21.9%.

Figure 11:
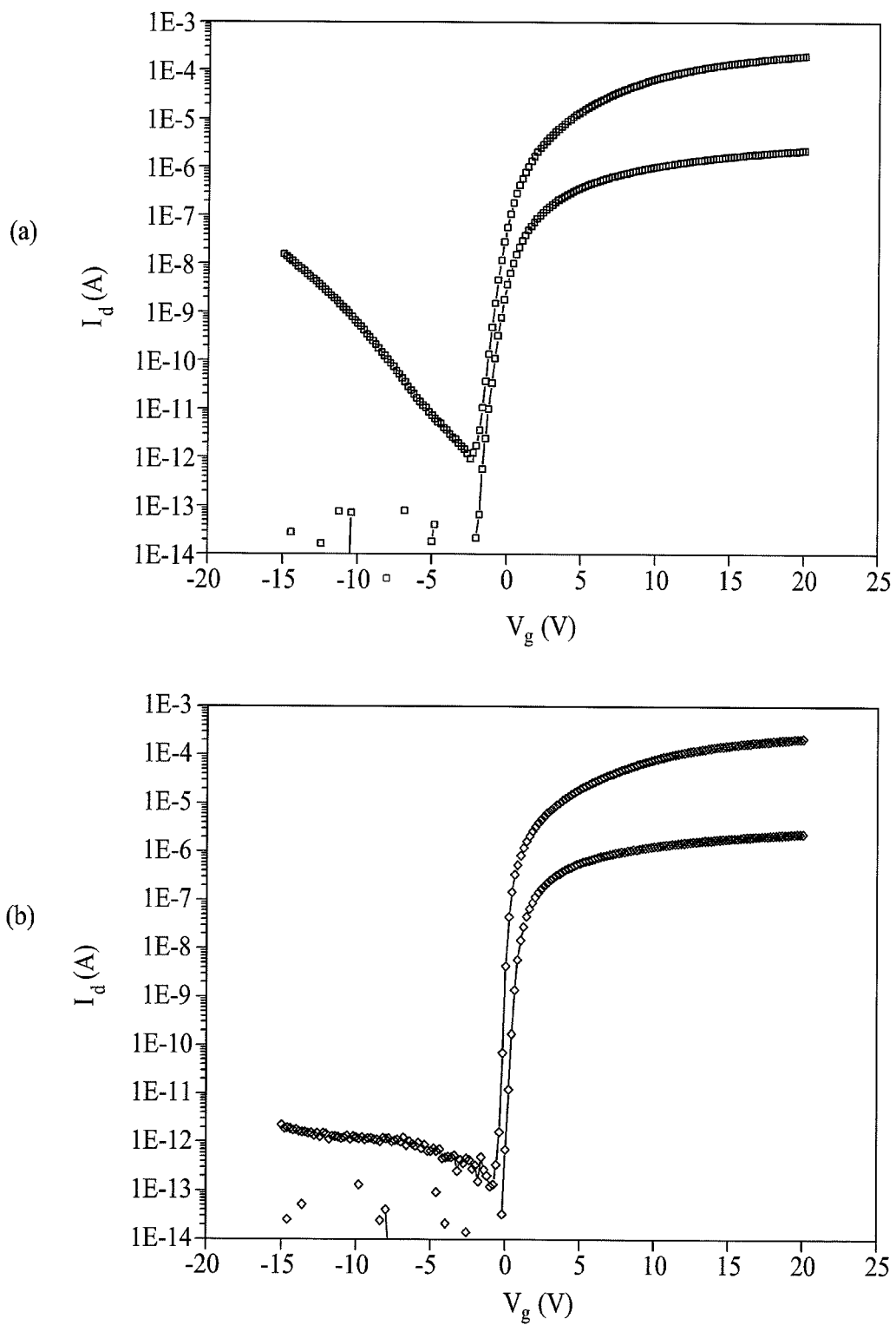
FIG. 11 is a diagram illustrating an Ioff field of a TFT based on positions of a source and a drain.

FIG. 11 is a diagram illustrating an Ioff field of a TFT based on positions of a source and a drain.

Referring to FIG. 11, an Ioff characteristic of a TFT may be changed depending on positions of a source and a drain.

For example, when the source and the drain are disposed to overlap a gate, the TFT has an Ioff characteristic illustrated in (a) of FIG. 11. In this case, the Ioff characteristic of the TFT is degraded, and for this reason, it is difficult to apply the TFT to a display device.

On the other hand, as illustrated in (a) and (b) of FIG. 6, when the LDD 144 is disposed to match the end of the gate 120 or the LDD 144 is disposed to pass over the end of the gate 120, the source 143 and the drain 142 may be disposed at an outer portion of the gate 120 (in other words, outside the gate; in still other words, at a portion that does not overlap the gate). As described above, in the LCD device according to an embodiment of the present invention, by applying the TFT having the bottom gate type, the length of the LDD 144 may be optionally adjusted, thereby satisfying a characteristic of a TFT.

When the source 143 and the drain 142 are disposed at an outer portion of the gate 120, the TFT has an Ioff characteristic illustrated in (b) of FIG. 11. As described above, the TFT having the bottom gate type according to an embodiment of the present invention has a good Ioff characteristic, thereby enhancing a performance of a display device.

Figure 12:
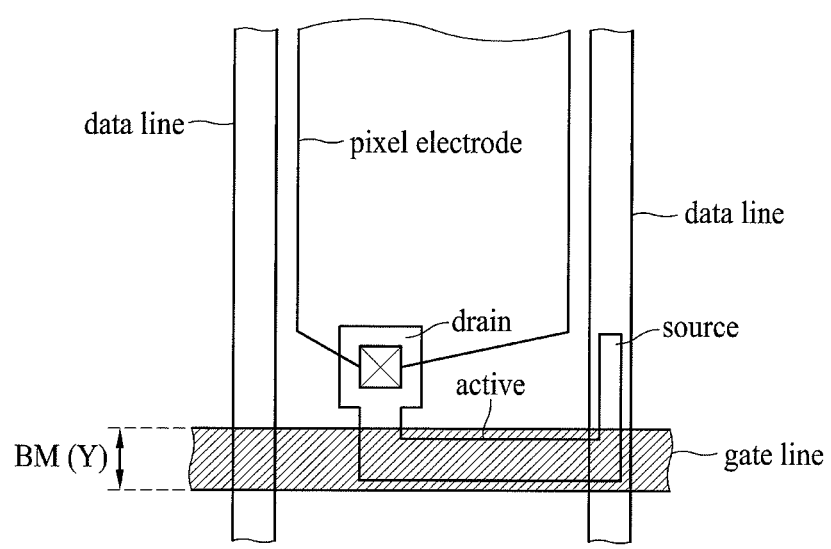
FIG. 12 is a plan view illustrating another embodiment where an aperture ratio of a pixel area increases in a structure where R, G, and B sub-pixels are arranged in a stripe type.

FIG. 12 is a plan view illustrating another embodiment where an aperture ratio of a pixel area increases in a structure where R, G, and B sub-pixels are arranged in a stripe type.

Referring to FIG. 12, when the R, G, and B sub-pixels are arranged in the stripe type, an active layer of a TFT may be formed on only a gate, and thus, a size of the TFT is reduced.

Here, a black matrix BM may be formed to cover a gate line. In this case, a width of the black matrix BM is reduced from X to Y (for example, 4 μm).

Figure 13:
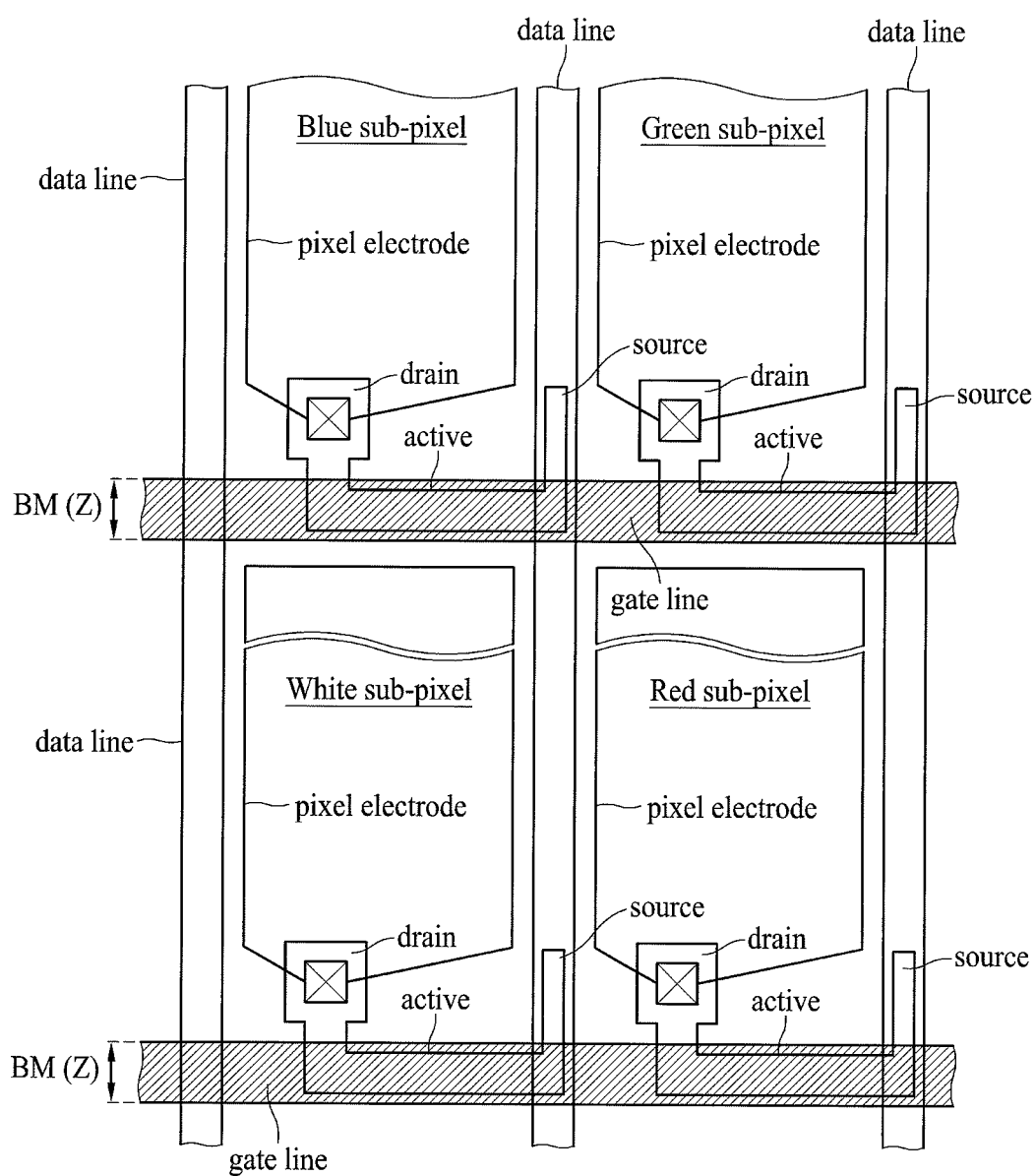
FIG. 13 is a plan view illustrating another embodiment where an aperture ratio of a pixel area increases in a structure where R, G, B, and W sub-pixels are arranged in a PenTile type.

FIG. 13 is a plan view illustrating another embodiment where an aperture ratio of a pixel area increases in a structure where R, G, B, and W sub-pixels are arranged in a PenTile type.

Referring to FIG. 13, when the R, G, B, and W sub-pixels are arranged in the PenTile type, an active layer of a TFT may be formed on only a gate, and thus, a size of the TFT is reduced.

Here, a black matrix BM may be formed to cover a gate line. In this case, a width of the black matrix BM is reduced from X to Z (for example, 4 μm).

In the LCD device according to an embodiment of the present invention, the multichannel including the plurality of sub-channels 141a and 141b may be formed in the TFT having the bottom gate type as illustrated in FIG. 14, and a width of the black matrix BM is reduced as illustrated in FIGS. 12 and 13. A width of the pixel area increases by the reduced width of the black matrix BM in the same pixel layout. Therefore, an aperture ratio of the pixel area increases, thereby enhancing a quality of an image displayed by the LCD device.

Moreover, in addition to TFTs in the pixel area, TFTs formed in a non-display area may be manufactured in the same type, and thus, a narrow bezel is realized by decreasing a size of a bezel that covers the non-display area.

In the method of manufacturing the LCD device according to embodiments of the present invention, since the active layer 141 is formed on only the gate 120, a degree of freedom of an impurity doping process increases in forming the channel, the source 143, and the drain 142, and thus, a high-reliability TFT is manufactured, and a size of the TFT is reduced.

Moreover, in the LCD device and the method of manufacturing the same according to the embodiments of the present invention, a mask process may be omitted in forming a lower substrate, and thus, a manufacturing process may be simplified, thereby reducing the manufacturing cost. Also, since the TFT is formed in the bottom gate type, a light shield layer may be removed, and thus, the number of manufacturing processes may be reduced.

Moreover, in the LCD device and the method of manufacturing the same according to the embodiments of the present invention, a driving performance of a TFT may be enhanced by using low temperature poly silicon (LTPS) as a material of an active layer.

As described above, in the LCD device according to the embodiments of the present invention, a transmittance of a pixel area increases, thereby enhancing a quality of a displayed image.

In the LCD device and the method of manufacturing the same according to the embodiments of the present invention, an efficiency of a channel design of a TFT increases.

In the LCD device and the method of manufacturing the same according to the embodiments of the present invention, a size of the TFT may be reduced by manufacturing a high-reliability TFT.

In the LCD device and the method of manufacturing the same according to the embodiments of the present invention, a narrow bezel may be realized.

In the method of manufacturing the same according to the embodiments of the present invention, since a mask process may be omitted in forming a lower substrate, the manufacturing cost may be reduced.

In the LCD device and the method of manufacturing the same according to the embodiments of the present invention, the number of manufacturing processes may be reduced by removing (or omitting) a light shield layer.

In the method of manufacturing the LCD device according to the embodiments of the present invention, the manufacturing efficiency may be enhanced by simplifying a process of manufacturing the lower substrate.

In the LCD device and the method of manufacturing the same according to the embodiments of the present invention, a driving performance of a TFT may be enhanced by using LTPS as a material of an active layer.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A liquid crystal display (LCD) device comprising:
   a plurality of pixel areas defined by intersections of a plurality of gate lines and a plurality of data lines;
   a gate disposed in a pixel area of the plurality of pixel areas, the pixel area disposed between a first data line and a second data line that is adjacent to the first data line among the plurality of data lines;
   a gate insulator disposed to cover the gate;
   a thin film transistor (TFT) configured to include the gate, a semiconductor layer having an active layer including a channel and disposed on the gate insulator, and a source disposed at a first side of the channel, and a drain disposed at a second side of the channel;
   a pixel electrode connected to the drain of the TFT and configured to supply a data voltage to the pixel area;
   a common electrode configured to supply a common voltage to the pixel area; and
   a lightly doped drain (LDD) disposed between the channel and the source and between the channel and the drain,
   wherein at least a portion of the LDD is disposed on the gate,
   wherein among the drain, the source and the channel of the semiconductor layer, only the channel extends along and overlaps a gate line of the pixel area, the gate line having a section defined from the first data line to the drain of the TFT and extending from the first data line to the drain of the TFT, and
   wherein the channel entirely overlaps the section of the gate line of the pixel area in parallel from the first data line to the drain of the TFT.

2. The LCD device of claim 1, wherein the LDD is disposed up to an area overlapping the gate.

3. The LCD device of claim 1, wherein the LDD is disposed up to an outer portion of the gate.

4. The LCD device of claim 1, wherein the TFT is formed in a bottom gate structure.

5. The LCD device of claim 1, wherein,
   at least one of the plurality of pixel areas comprises a red sub-pixel, a green sub-pixel, and a blue sub-pixel, and
   the red sub-pixel, the green sub-pixel, and the blue sub-pixel are arranged in a stripe type.

6. The LCD device of claim 1, wherein,
   at least one of the plurality of pixel areas comprises a red sub-pixel, a green sub-pixel, a blue sub-pixel, and a white sub-pixel, and
   the red sub-pixel, the green sub-pixel, the blue sub-pixel, and the white sub-pixel are arranged in a PenTile type.

7. The LCD device of claim 1, wherein a width of a black matrix (BM), which is formed on an upper substrate to cover a gate line of the plurality of gate lines, is formed from 4 μm to 15.0 μm.

8. The LCD device of claim 1, further comprising a black matrix (BM) disposed to cover the TFT.

9. The LCD device of claim 1, wherein the channel of the active layer comprises a single channel, or a multichannel comprising a plurality of sub-channels.

10. The LCD device of claim 1, wherein the gate line entirely overlaps with the channel between the first side and the second side of the channel.

11. The LCD device of claim 1, wherein the channel does not transect the gate line of the pixel area.

12. A display device comprising:
    a gate line formed in a first direction and including a gate;
    a data line formed in a second direction;
    a gate insulator disposed on the gate line;
    a semiconductor layer disposed on the gate insulator and including an active layer having a channel, a source disposed at a first side of the channel, and a drain disposed at a second side of the channel; and
    a lightly doped drain (LDD) disposed between the channel and the source and between the channel and the drain,
    wherein among the drain, the source and the channel, only the channel is formed to extend in the first direction and overlap the gate line, and the source is formed to extend in the second direction and overlap the data line, the gate line having a section defined from the data line to the drain and extending from the data line to the drain, and
    wherein the channel entirely overlaps the section of the gate line in parallel from the data line to the drain.

13. The display device of claim 12, wherein the source and the drain are disposed at an outer portion of the gate so that the source and the drain do not overlap the gate line.

14. The display device of claim 12, wherein an outer end of the LDD is disposed to match an outer end of the gate.

15. The display device of claim 12, wherein portions of the gate insulator do not overlap the gate line, and the source and the drain are disposed on a portion of the gate insulator that does not overlap the gate line.

16. The display device of claim 12, wherein the gate line entirely overlaps with the channel between the first side and the second side of the channel.

17. The display device of claim 12, wherein the channel does not transect the gate line.

* * * * *